(12) United States Patent
Park et al.

(10) Patent No.: US 10,966,325 B2
(45) Date of Patent: Mar. 30, 2021

(54) FLEXIBLE DISPLAY APPARATUS AND MANUFACTURING METHOD THEREOF

(71) Applicant: SAMSUNG DISPLAY CO., LTD., Yongin-si (KR)

(72) Inventors: Eungseok Park, Yongin-si (KR); Wonmin YuN, Yongin-si (KR); Byoungduk Lee, Yongin-si (KR); Yunah Chung, Yongin-si (KR); Yoonhyeung Cho, Yongin-si (KR); Yongchan Ju, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 603 days.

(21) Appl. No.: 15/156,355

(22) Filed: May 17, 2016

(65) Prior Publication Data

US 2017/0020007 A1  Jan. 19, 2017

(30) Foreign Application Priority Data

Jul. 15, 2015 (KR) .................. 10-2015-0100514

(51) Int. Cl.

| | |
|---|---|
| *H05K 5/00* | (2006.01) |
| *H05K 3/46* | (2006.01) |
| *H05K 1/02* | (2006.01) |
| *H01L 27/12* | (2006.01) |
| *G06F 1/16* | (2006.01) |
| *H01L 21/28* | (2006.01) |

(52) U.S. Cl.
CPC ......... *H05K 3/4644* (2013.01); *G06F 1/1615* (2013.01); *G06F 1/1652* (2013.01); *H01L 21/28* (2013.01); *H01L 27/1218* (2013.01); *H05K 1/028* (2013.01); *C09K 2323/00* (2020.08); *H05K 2201/10128* (2013.01)

(58) Field of Classification Search
CPC ................. H05K 3/4644; H05K 1/028; H05K 2201/10128; H01L 27/1218; H01L 21/28; G06F 1/1652; G06F 1/1615; C09K 2323/00
See application file for complete search history.

(56) References Cited

U.S. PATENT DOCUMENTS

| | | |
|---|---|---|
| 2008/0238301 A1 | 10/2008 | Shim et al. |
| 2010/0308335 A1 | 12/2010 | Kim et al. |
| 2011/0062475 A1 | 3/2011 | Cho |

(Continued)

FOREIGN PATENT DOCUMENTS

| | | |
|---|---|---|
| KR | 10-2008-0088991 A | 10/2008 |
| KR | 10-2010-0130898 A | 12/2010 |

(Continued)

*Primary Examiner* — Anthony J Frost
(74) *Attorney, Agent, or Firm* — Lewis Roca Rothgerber Christie LLP

(57) ABSTRACT

A flexible display apparatus, including a flexible substrate including a bending area and a non-bending area; a display unit on the flexible substrate; and an encapsulation unit covering the display unit, the encapsulation unit including a first inorganic film, a second inorganic film, and an organic film between the first inorganic film and the second inorganic film, the organic film having a first thickness in the bending area and a second thickness greater than the first thickness in the non-bending area.

18 Claims, 7 Drawing Sheets

(56) References Cited

U.S. PATENT DOCUMENTS

| | | | |
|---|---|---|---|
| 2011/0140163 A1* | 6/2011 | Oh | H01L 51/5256 257/100 |
| 2012/0033353 A1* | 2/2012 | Huang | G06F 9/33 361/679.01 |
| 2013/0169515 A1* | 7/2013 | Prushinskiy | G06F 1/1652 345/55 |
| 2014/0029212 A1* | 1/2014 | Hwang | G09F 9/301 361/749 |
| 2014/0098471 A1* | 4/2014 | Nam | H05K 7/00 361/679.01 |
| 2014/0240985 A1 | 8/2014 | Kim et al. | |

FOREIGN PATENT DOCUMENTS

| | | |
|---|---|---|
| KR | 10-2011-0029311 A | 3/2011 |
| KR | 10-2011-0065854 A | 6/2011 |

* cited by examiner

FLEXIBLE DISPLAY APPARATUS AND MANUFACTURING METHOD THEREOF

CROSS-REFERENCE TO RELATED APPLICATION

Korean Patent Application No. 10-2015-0100514, filed on Jul. 15, 2015, in the Korean Intellectual Property Office, and entitled: "Flexible Display Apparatus and Manufacturing Method Thereof," is incorporated by reference herein in its entirety.

BACKGROUND

1. Field

One or more exemplary embodiments relate to a flexible display apparatus and a manufacturing method thereof.

2. Description of the Related Art

Among display apparatuses, an organic light-emitting device may be a next-generation display apparatus, because organic light-emitting devices may have fast response times as well as wide viewing angles and excellent contrast.

SUMMARY

Embodiments may be realized by providing a flexible display apparatus, including a flexible substrate including a bending area and a non-bending area; a display unit on the flexible substrate; and an encapsulation unit covering the display unit, the encapsulation unit including a first inorganic film, a second inorganic film, and an organic film between the first inorganic film and the second inorganic film, the organic film having a first thickness in the bending area and a second thickness greater than the first thickness in the non-bending area.

The non-bending area may include a first non-bending area and a second non-bending area, and the bending area may be between the first non-bending area and the second non-bending area.

The bending area may include a first bending area and a second bending area, and the non-bending area may be between the first bending area and the second bending area.

The first bending area may have a first curvature, and the second bending area may have a second curvature smaller than the first curvature.

The organic film in the first bending area may be thinner than the organic film in the second bending area.

The organic film may be formed according to a liquid phase deposition process.

Embodiments may be realized by providing a manufacturing method of a flexible display apparatus, the method including providing a flexible substrate including a bending area and a non-bending area; forming a display unit on the flexible substrate; forming a first inorganic film covering the display unit; forming an organic film on the first inorganic film, the organic film having a first thickness in the bending area and a second thickness greater than the first thickness in the non-bending area; and forming a second inorganic film on the organic film.

The non-bending area may include a first non-bending area and a second non-bending area, and the bending area may be between the first non-bending area and the second non-bending area.

The bending area may include a first bending area and a second bending area, and the non-bending area may be between the first bending area and the second bending area.

The first bending area may have a first curvature, and the second bending area may have a second curvature smaller than the first curvature.

The organic film in the first bending area may be thinner than the organic film in the second bending area.

The organic film may be formed according to a liquid phase deposition process.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
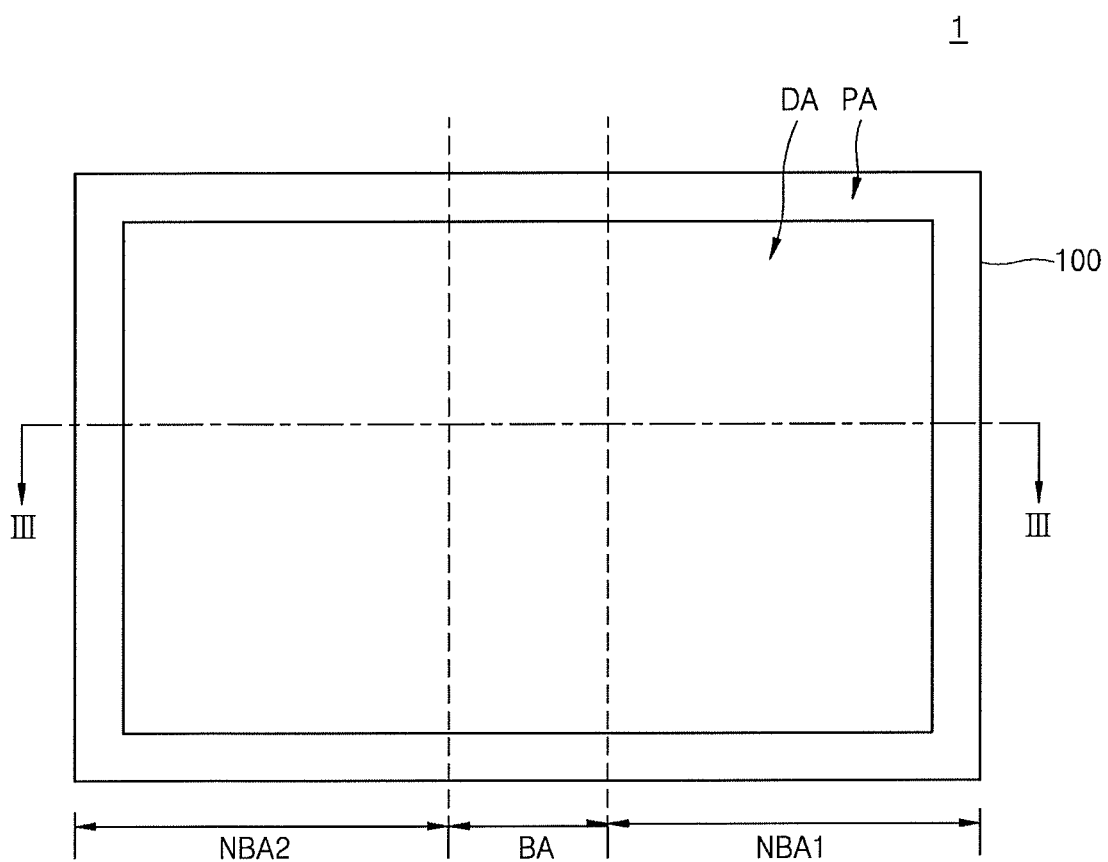
FIG. 1 illustrates a schematic plan view of a flexible display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Reference will now be made in detail to exemplary embodiments, examples of which are illustrated in the accompanying drawings, wherein like reference numerals refer to like elements throughout.

It will be understood that although the terms "first", "second", etc., may be used herein to describe various components, these components should not be limited by these terms. These components are only used to distinguish one component from another.

It will be further understood that the terms "comprises" and/or "comprising" used herein specify the presence of stated features or components, but do not preclude the presence or addition of one or more other features or components. It will be understood that when a layer, region, or component is referred to as being "formed on," another layer, region, or component, it can be directly or indirectly formed on the other layer, region, or component. That is, for example, intervening layers, regions, or components may be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list FIG. 1 illustrates a schematic plan view of a flexible display apparatus 1 according to an embodiment, FIG. 2 illustrates a schematic side view of a bent structure of the flexible display apparatus 1 of FIG. 1, and FIG. 3 illustrates a schematic cross-sectional view taken along a line III-III' of FIG. 1.

Figure 2:
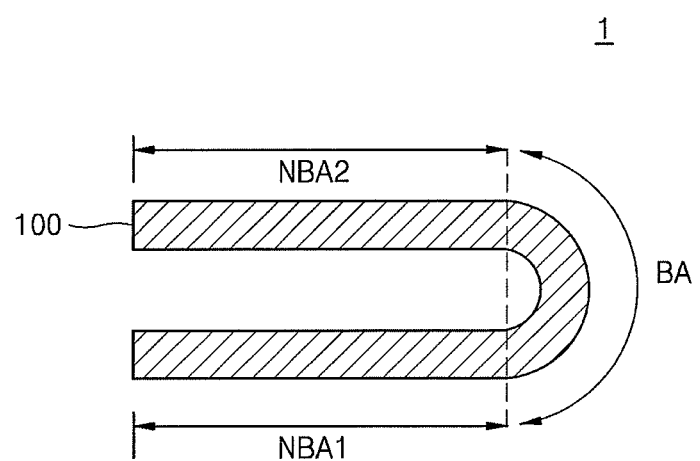
FIG. 2 illustrates a schematic side view of a bent structure of the flexible display apparatus of FIG. 1.
Figure 3:
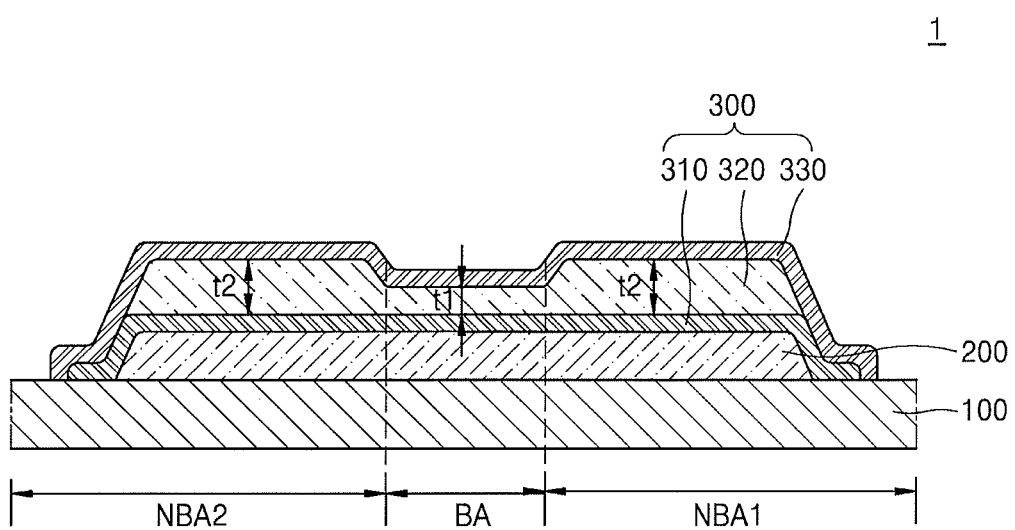
FIG. 3 illustrates a schematic cross-sectional view taken along a line of FIG. 1.

Referring to FIGS. 1 through 3, the flexible display apparatus 1 according to an embodiment may include a flexible substrate 100 having a bending area BA and a non-bending area NBA, a display unit 200 disposed on the flexible substrate 100, and an encapsulation unit 300. The encapsulation unit 300 according to an embodiment may include a first inorganic film 310, a second inorganic film 330, and an organic film 320 disposed between the first inorganic film 310 and the second inorganic film 330.

The flexible substrate 100 may have a characteristic of flexibility and may include various materials, for example, a metal or a plastic material of polyethylene terephthalate (PET), polyethylene naphthalate (PEN), or polyimide. The flexible substrate 100 may include a display area DA corresponding to the display unit 200 and a peripheral area (PA) surrounding the display area DA.

The flexible substrate 100 may have the characteristic of flexibility, and the flexible substrate 100 may have a structure that is bendable and foldable. In the present embodiment, the flexible substrate 100 may have the bending area BA and the non-bending area NBA. As illustrated in FIG. 1, the bending area BA may be between a first bending area BA1 and a second bending area BA2. In the flexible display apparatus 1 according to the present embodiment, a first non-bending area NBA1 and a second non-bending area NBA2 may be arranged to face each other with respect to an axis in an extension direction of the bending area BA. FIG. 2 illustrates, for example, the first non-bending area NBA1 and the second non-bending area NBA2 that may be parallel in a folded structure. An angle formed by the first non-bending area NBA1 and the second non-bending area NBA2 may vary according to a bendable degree of the bending area BA.

The display unit 200 may be disposed on the flexible substrate 100. The display unit 200 may be disposed on an outer side or inner side of the flexible substrate 100.

Referring to FIG. 3, the display unit 200 may be disposed on the flexible substrate 100, and the display area DA may be an area in which the display unit 200 may be disposed.

The display unit 200 may include a plurality of pixels and thin film transistors and capacitors (CAPs) to supply signals to the respective pixels. The display unit 200 may be an organic light-emitting display unit or a liquid crystal display unit. The present embodiment is a case in which the display unit 100 is an organic light-emitting display unit.

The encapsulation unit 300 may include the first inorganic film 310, the second inorganic film 330, and the organic film 320 disposed between the first inorganic film 310 and the second inorganic film 320. The encapsulation unit 300 may cover the display unit 200, and seal the display unit 200 from external oxygen and moisture. The first inorganic film 310 and the second inorganic film 330 may be an inorganic compound, for example, silicon oxide or silicon nitride.

The organic film 320 disposed between the first inorganic film 310 and the second organic film 330 may have a first thickness t1 in the bending area BA and a second thickness t2 in the non-bending area NBA. The first thickness t1 of the organic film 320 may be less than the second thickness t2 of the organic film 320. The second thickness t2 of the organic film 320 disposed in the first and second non-bending areas NBA1 and NBA2 may be thicker than the first thickness t1 of the organic film 320 disposed in the bending area BA.

The organic film 320 may be formed by using a liquid phase deposition process, for example, an inkjet printing process. As described above, the organic film 320 may be formed to have the first and second non-bending areas NBA1 and NBA2 thicker than the bending area BA. The organic film 320 may be formed by controlling the amount of an organic compound applied during a process of forming the organic film 320.

The organic film 320 may minimize stress at the bending area BA when the flexible display apparatus 1 according to an embodiment is bent or folded at the bending area BA. When the flexible display apparatus 1 is bent, there may exist a neutral plane without stress since the tensile force may be the same as the compression force inside the flexible display apparatus 1. The stress inside the flexible display apparatus 1 may increase according to a distance from the neutral plane. When a structure vulnerable to the stress is disposed above an upper side or below a lower side with respect to the neutral plane, the structure may be exposed to continuing stress by receiving the tensile force and the compression force. The stress applied to the structure may be reduced by partially reducing the thickness of the flexible display apparatus 1, and moving the neutral plane to a position of the structure.

In the flexible display apparatus 1 according to an embodiment, a thickness of the organic film 320 of the encapsulation unit 300 formed on the bending area BA may be partially adjusted. A position of the neutral plane may be controlled by forming the organic film 320 of the encapsulation unit 300 to be relatively thinner than in the first and second non-bending areas NBA1 and NBA2. A flexible display apparatus 1 that may have minimized stress may be realized by disposing the structure vulnerable to the stress on the neutral plane.

Figure 4:
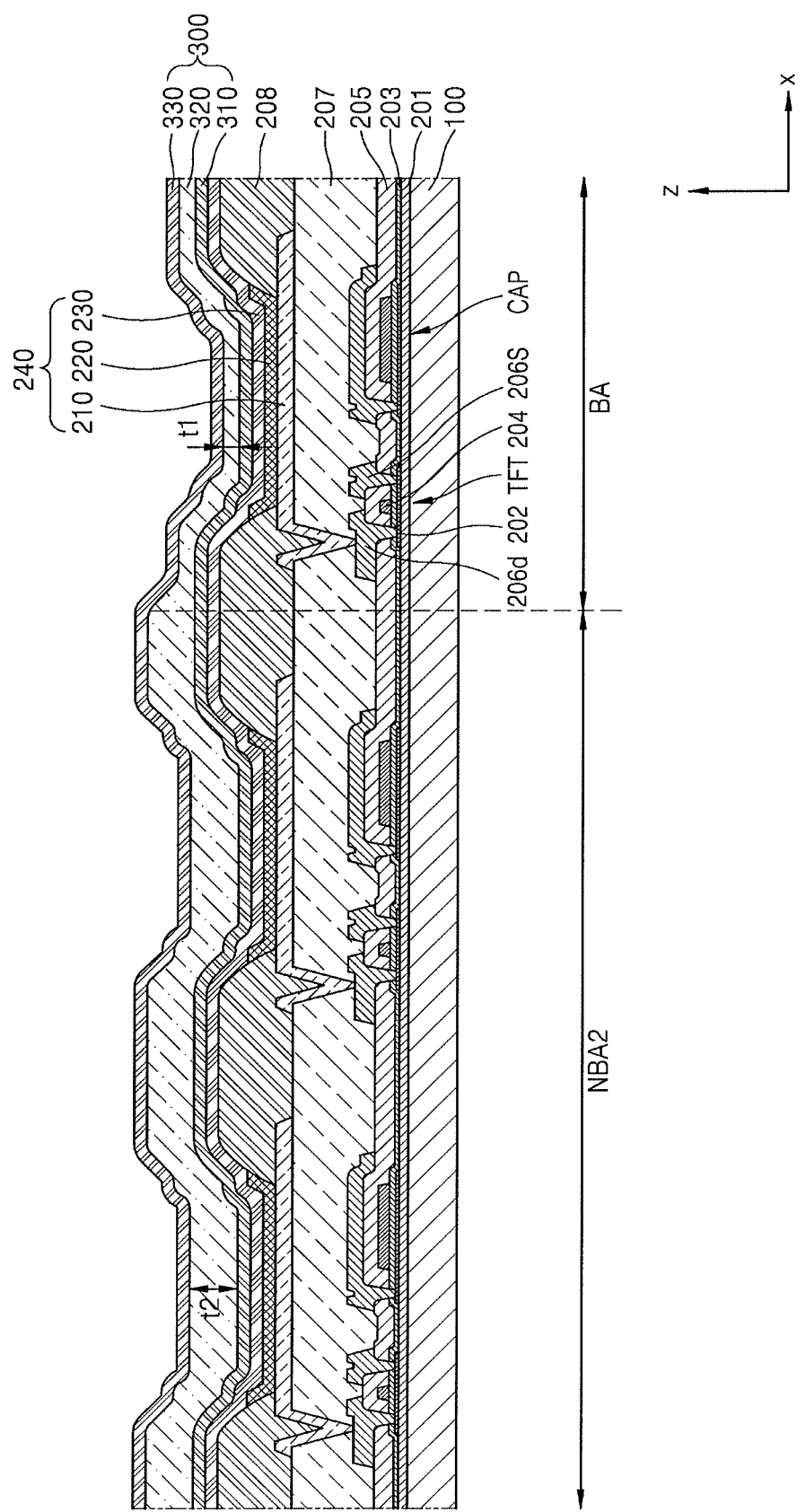
FIG. 4 illustrates a schematic cross-sectional view of the inside of the flexible display apparatus of FIG. 1.

FIG. 4 illustrates a schematic cross-sectional view of the inside of the display unit 200 of the flexible display apparatus 1 of FIG. 1.

The display unit 200 may include a plurality of pixels and the thin film transistors TFTs and CAPs electrically connected to the pixels to supply power to the pixels. The display unit 200 may be an organic light-emitting unit or a liquid crystal display unit. The present embodiment is a case in which the display unit 200 is an organic light-emitting unit. The thin film transistor TFT may include a semiconductor layer 202 including amorphous silicon, polycrystalline silicon, or an organic semiconductor material, a gate electrode 204, a source electrode 206s, and a drain electrode 206d. A structure of the thin film transistor TFT will be explained in detail below.

First, a buffer layer 201 including silicon oxide or silicon nitride may be disposed on the flexible substrate 100 to flatten a surface of the flexible substrate 100 and prevent introduction of impurities into the semiconductor layer 202 of the thin film transistor TFT. The semiconductor layer 202 may be disposed on the buffer layer 201.

The gate electrode 204 may be disposed on the semiconductor layer 202, and the source electrode 206s and the drain electrode 206d may be electrically connected to each other according to a signal applied to the gate electrode 204. The gate electrode 204 may have adhesiveness with an adjacent layer, a surface flatness of a stacked layer, and workability, and may include a single layer or a multilayer including one or more of aluminum (Al), platinum (Pt), palladium (Pd), silver (Ag), magnesium (Mg), Gold (Au), Nickel (Ni), Neodymium (Nd), iridium (Ir), Chromium (Cr), Lithium (Li), Calcium (Ca), molybdenum (Mo), titanium (Ti), tungsten (W), or copper (Cu).

A gate insulation film 203 including silicon oxide and/or silicon nitride may be disposed between the semiconductor layer 202 and the gate electrode 204 to insulate the semiconductor layer 202 and the gate electrode 204 from each other.

An interlayer insulation film 205 may be disposed on the gate electrode 204.

The interlayer insulation film 205 may include a single layer or a multilayer including a material, such as, silicon oxide or silicon nitride.

The source electrode 206s and the drain electrode 206d may be disposed on the interlayer insulation film 205. The source electrode 206s and the drain electrode 206d may be electrically connected to the semiconductor layer 202 through a contact hole formed in the interlayer insulation film 205 and the gate insulation layer 203. The source electrode 206s and the drain electrode 206d may have electrical conductivity and may include a single layer or a multilayer including one or more of aluminum (Al), platinum (Pt), palladium (Pd), silver (Ag), magnesium (Mg), Gold (Au), Nickel (Ni), Neodymium (Nd), iridium (Ir), Chromium (Cr), Lithium (Li), Calcium (Ca), molybdenum (Mo), titanium (Ti), tungsten (W), or copper (Cu).

A protection layer may be formed to cover the thin film transistor TFT to protect the thin film transistor having the above-described structure. The protection layer may include an inorganic compound, such as, silicon oxide, silicon nitride or silicon oxynitride.

A planarization film 207 may be disposed on the flexible substrate 100. The planarization film 207 may flatten an upper side of the thin film transistor TFT and protect the thin film transistor and various components when an organic light-emitting device is disposed on the thin film transistor TFT. The planarization film 207 may include an acryl-based organic compound or benzoncylobutene (BCB), for example. As illustrated in FIG. 4, the buffer layer 201, the gate insulation layer 203, the interlayer insulation layer 205, and the planarization film 207 may be formed on the entire flexible substrate 100.

A pixel-defining film 208 may be disposed on the thin film transistor TFT. The pixel-defining film 208 may be disposed on the above-described planarization film 207 and may have an opening. The pixel-defining film 208 may define a pixel area on the flexible substrate 100.

The pixel-defining film 208 may include an organic insulation film, for example. The organic insulation film may include acrylic polymer such as poly(methyl methacrylate) (PMMA), polystyrene (PS), a poly derivative having a phenol group, imide polymer, acryl ester-based polymer, amide-based polymer, fluorine-based polymer, p-xylene polymer, vinyl alcohol polymer, or a mixture thereof.

An organic light-emitting device 240 may be disposed on the pixel-defining film 208. The organic light-emitting device 240 may include a pixel electrode 210, an intermediate layer 220 including an emission layer EML, and an opposite electrode 230.

The pixel electrode 210 may be a (semi-)transparent electrode or a reflective electrode. When the pixel electrode 210 is a (semi-)transparent electrode, the pixel electrode 210 may be, for example, indium tin oxide (ITO), indium zinc oxide (IZO), zinc oxide (ZnO), indium oxide (In$_2$O$_3$), indium gallium oxide (IGO), or aluminum zinc oxide (AZO). When the pixel electrode 210 is a reflective electrode, the pixel electrode 210 may include a reflective layer having, for example, silver (Ag), magnesium (Mg), aluminum (Al), platinum (Pt), palladium (Pd), gold (Au), Nickel (Ni), Neodymium (Nd), Iridium (Ir), chromium (Cr), and/or a mixture thereof, and a layer having indium tin oxide (ITO), indium zinc oxide (IZO), zinc oxide (ZnO), indium oxide (In$_2$O$_3$), indium gallium oxide (IGO), or aluminum zinc oxide (AZO). In an embodiment, various materials may be usable, and a structure thereof may be variously changed to, for example, a single layer or a multilayer.

The intermediate layer 220 may be disposed on the pixel area defined by the pixel-defining film 208. The intermediate layer 220 may include an emission layer EML that may emit light according to an electrical signal. In addition to the emission layer EML, the intermediate layer 220 may be, for example, a single layer or a complex structure including a hole injection layer (HIL) disposed between the emission layer EML and the pixel electrode 210, a hole transport layer (HTL), and an electron transport layer (ETL) disposed between the emission layer (EML) and the opposite electrode 230, or an electron injection layer (EIL). In an embodiment, the intermediate layer 220 may have various structures.

The opposite electrode 230 covering the intermediate layer 220 including the emission layer EML and disposed opposite to the pixel electrode 210 may be formed on the whole area of the flexible substrate 100. The opposite electrode 230 may be a (semi-) transparent electrode or a reflective electrode.

When the opposite electrode 230 includes a semi-transparent electrode, the opposite electrode 230 may include a metal layer having a low-work function, for example, lithium (Li), calcium (Ca), lithium fluoride calcium (LiF/Ca), lithium fluoride aluminum (LiF/Al), aluminum (Al), silver (Ag), magnesium (Mg), and/or a mixture thereof, and a (semi-) transparent conductive layer of indium tin oxide (ITO), indium zinc oxide (IZO), zinc oxide (ZnO), or indium oxide (In$_2$O$_3$). When the opposite electrode 230 includes a reflective electrode, the opposite electrode 230 may include a layer including lithium (Li), calcium (Ca), lithium fluoride calcium (LiF/Ca), lithium fluoride aluminum (LiF/Al), aluminum (Al), silver (Ag), magnesium (Mg), and/or a mixture thereof. In an embodiment, a structure and a material of the opposite electrode 230 may be changeable variously.

Referring to FIG. 4, the encapsulation unit 300 may be disposed on the flexible substrate 100 to cover the display unit 200. The encapsulation unit 300 may be a multilayer including at least one inorganic film and an organic film 320.

The encapsulation unit 300 may effectively seal the display unit 200 from oxygen and moisture from outside by including the multilayer. In the present embodiment, the encapsulation unit 300 may include the first inorganic film 310, the second inorganic film 330, and the organic film 320 disposed between the first inorganic film 310 and the second inorganic film 330.

The first inorganic film 310 and the second inorganic film 330 may include an inorganic compound and may include the same material or different materials. The materials forming the first inorganic film 310 and the second inorganic film 330 may be independent, for example, one or more of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride (SiON).

The organic film 320 may include an organic compound and may include one or more of acryl resin, methacrylic resin, polyisoprene, vinyl resin, epoxy resin, urethane resin, cellulose resin, or perylene resin. The organic film 320 may be formed by using a liquid phase deposition process, for example, an inkjet printing process.

FIG. 4 illustrates a cross-sectional view of the display unit 200 including a boundary of the bending area BA and the non-bending area NBA. As stated above, the organic film 320 may have the first thickness t1 in the bending area BA and the second thickness t2 in the non-bending area NBA. The first thickness t1 of the organic film 320 in the bending area BA may be less than the second thickness t2 of the organic film 320 in the non-bending area NBA. The flexible display apparatus 1 according to an embodiment may reduce, minimize, or eliminate stress applied to the display unit 200 during bending and folding by partially adjusting a thickness of the organic film 320 of the encapsulation unit 300. The organic film 320 in the bending area BA may be formed to be relatively thinner than the organic film 320 in the non-bending area NBA to control a position of the neutral plane inside the flexible display apparatus 1. The structure vulnerable to stress may be positioned on the neutral plane to realize a flexible display apparatus 1 that may have minimized stress.

Figure 5:
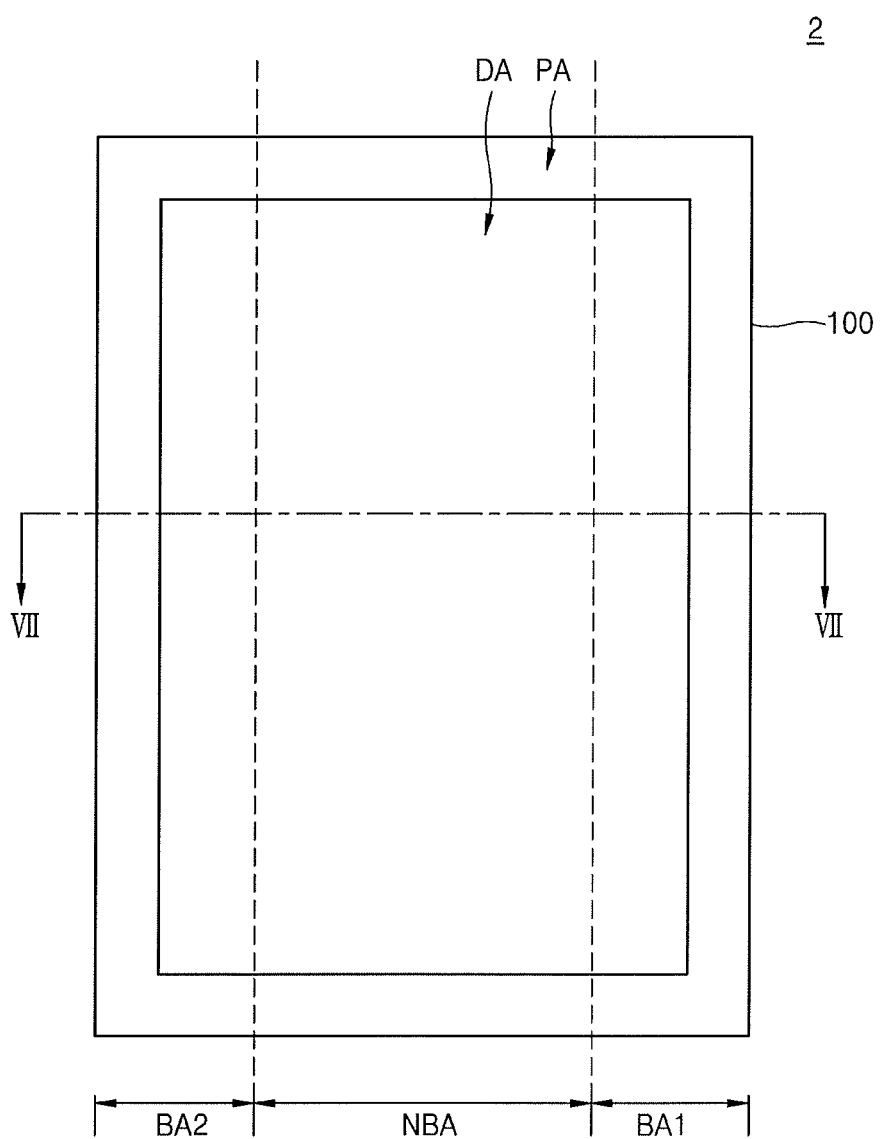
FIG. 5 illustrates a schematic plan view of a flexible display apparatus according to an embodiment.
Figure 6:
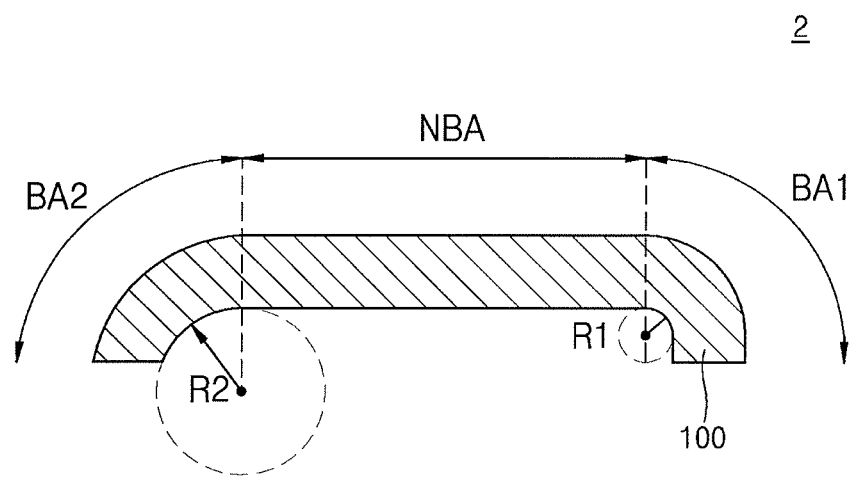
FIG. 6 illustrates a schematic side view of a bent structure of the flexible display apparatus of FIG. 5.
Figure 7:
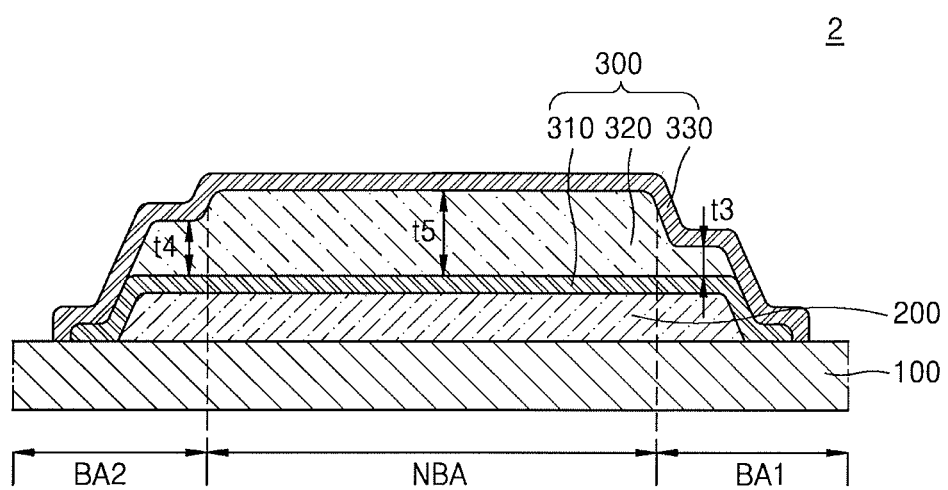
FIG. 7 illustrates a schematic cross-sectional view taken along a line VII-VII' of FIG. 5.

FIG. 5 illustrates a schematic plan view of a flexible display apparatus 2 according to an embodiment, FIG. 6 illustrates a schematic side view of a bent structure of the flexible display apparatus 2 of FIG. 5, and FIG. 7 illustrates a schematic cross-sectional view of the flexible display apparatus 2 along a line VII-VII' of FIG. 5. A display unit 200 of the flexible display apparatus 2 illustrated in FIGS. 5 to 7 may have the same structure as or a similar structure to the display unit 200 of FIG. 4, and descriptions of the display unit 200 of FIGS. 5 to 7 correspond to the descriptions of the display unit of FIG. 4.

Referring to FIGS. 5 to 7, the flexible display apparatus 2 according to an embodiment may include a flexible substrate 100, the display unit 200 disposed on the flexible substrate 100 having a bending area BA and a non-bending area NBA, and an encapsulation unit 300. The encapsulation unit 300 according to an embodiment may include a first inorganic film 310, a second inorganic film 330, and an organic film 320 disposed between the first inorganic film 310 and the second inorganic film 330.

The flexible substrate 100 may have a characteristic of flexibility and may include various materials, for example, a metal material or a plastic material such as polyethylene terephthalate (PET), polyethylene naphthalate (PEN), or polyimide. The flexible substrate 100 may include a display area formed with the display unit 200 and a peripheral area disposed to surround the display area.

The flexible substrate 100 may have a bendable or foldable structure due to, for example, the flexible characteristic. In the present embodiment, the flexible substrate 100 may include a bending area BA and a non-bending area NBA, and the non-bending area NBA may be between a first bending area BA1 and a second bending area BA2 as illustrated in FIG. 5. The flexible display apparatus 2 according to the present embodiment may be bendable such that the first bending area BA1 and the second bending area BA2 have predetermined curvatures. As illustrated in FIG. 6, the first bending area BA1 may have a first curvature radius R1 and the second bending BA2 may have a second curvature radius R2 greater than the first curvature radius R1. The first bending area BA1 may have a curvature greater than that of the second bending area BA2. In an embodiment, the first bending area BA1 and the second bending area BA2 may have a same curvature.

The display unit 200 may be disposed on the flexible substrate 100. The display unit 200 may be disposed inside or outside the flexible substrate 100.

Referring to FIG. 7, the display unit 200 may be disposed on the flexible substrate 100 and may be disposed in a display area DA. The display unit 200 may include a plurality of pixels and also include thin film transistors TFTs and CAPs to supply electrical power to the respective pixels. The display unit 200 may be an organic light-emitting display unit or a liquid crystal display unit. The present embodiment is a case in which the display unit 200 is an organic light-emitting display unit.

The encapsulation unit 300 may include the first inorganic film 310, the second inorganic film 330, and the organic film 320 disposed between the first inorganic film 310 and the second inorganic film 330. The encapsulation unit 300 may cover the display unit 200 and seal the display unit 200 from external oxygen and moisture. The first inorganic film 310 and the second inorganic film 330 may include an inorganic compound, for example, silicon oxide or silicon nitride.

The organic film 320 disposed between the first inorganic film 310 and the second inorganic film 3330 may have a thickness of the non-bending area NBA thicker than those of the bending areas BA1 and BA2. In the present embodiment, the first bending area BA1 may have a third thickness t3, the second bending area BA2 may have a fourth thickness t4, and the non-bending area NBA may have a fifth thickness t5. The third and fourth thicknesses t3 and t4 of the organic film 320 in the bending areas BA1 and BA2 may be relatively less than the fifth thickness t5 of the organic film 320 in the non-bending area NBA.

As describe above, the first bending area BA1 may have a first curvature radius R1 and the second bending BA2 may have a second curvature radius R2 greater than the first curvature radius R1, and the first bending area BA1 may have a curvature greater than that of the second bending area BA2. The organic film 320 disposed in the first bending area BA1 may have the third thickness t3 less than the fourth thickness t4 of the organic film 320 in the second bending area BA2.

The organic film 320 may be formed by using the liquid phase deposition process, for example, the inkjet printing process. A thickness of the organic film 320 may be adjusted by controlling the amount of an organic compound applied during forming the organic film 320.

The organic film 320 of the flexible display apparatus 2 according to an embodiment may minimize the stress in the bending areas BA1 and BA2 when being bent or folded in the bending areas BA1 and BA2. When the flexible display apparatus 2 is bent, there may exist a neutral plane without stress since the tensile force and the compression force may be same inside the flexible display apparatus 2, and the stress in the flexible display apparatus 2 may increase according to a distance from the neutral plane. When a structure vulnerable to the stress is disposed on an upper side or a lower side with respect to the neutral plane, the structure may be exposed to continuing stress from the tensile force and the compression force. The stress that may be applied to the structure may be reduced when the neutral plane moves to a position of the structure by partially adjusting a thickness of the flexible display apparatus 2.

In the flexible display apparatus 2 according to an embodiment a thickness of the organic film 320 of the encapsulation unit 300 formed on a bending area may be controlled. The organic film 320 in the bending areas BA1 and BA2 may be relatively thinner than that of the non-bending area NBA to control a position of the neutral plane. By disposing the structure vulnerable to the stress on the neutral plane, a flexible display apparatus 2 having minimized stress may be realized.

Embodiments include the flexible display apparatus, which has been explained. Embodiments also include a manufacturing method of a flexible display apparatus to manufacture such a flexible display apparatus.

Referring FIGS. 1 to 4, the method may include preparing the flexible substrate 100 having the bending area BA and the non-bending area NBA. The flexible substrate 100 may have a flexible characteristic and may include various materials, for example, a metal material or a plastic material such as polyethylene terephthalate (PET), polyethylene naphthalate (PEN), or polyimide. In the present embodiment, the flexible substrate 100 may include the bending area BA and the non-bending area NBA, and the bending area BA may be disposed between the first non-bending area NBA1 and the second non-bending area NBA2 as illustrated in FIG. 1. FIG. 2 illustrates, for example, a structure in which the first non-bending area NBA1 and the second non-bending area NBA2 may be disposed parallel to each other to form a folded structure. In an embodiment, it may be possible to change the structure to various forms according to a bending degree of the bending area BA.

The method may include forming the display unit 200 on the flexible substrate 100. The display unit 200 may be disposed inside or outside of the flexible substrate 100.

Referring to FIG. 4, various components of the display unit 200 of the flexible display apparatus 1 may be disposed on the flexible substrate 100. Common layers, such as, the buffer layer 201, the gate insulation film 203, the interlayer insulation film 205, may be formed on the entire flexible substrate 100. After the buffer layer 201 is formed, a patterned semiconductor layer 202 may be formed on the buffer layer 201. The gate electrode 204, the source electrode 206s, and the drain electrode 207d as components of the thin film transistor TFT may be formed together with the pattern semiconductor layer 202.

The planarization film 207 having a flat upper surface may be formed on the entire flexible substrate 100 to cover the thin film transistor TFT. A patterned pixel electrode 210 may be formed on the planarization film 207. The pixel electrode 210 may be electrically connected to the thin film transistor TFT through a via hole formed in the planarization film 207. Thereafter, the pixel-defining film 208 may be formed to expose a center portion of the pixel electrode 210 and to cover a boundary portion of the pixel electrode 210. The pixel-defining film 208 may define the pixel area. The intermediate layer 220 including a light-emitting layer may be formed in the pixel area defined by the pixel-defining film 208. The intermediate layer 220 may have one layer as a common layer to partially correspond to the flexible substrate 100 or the other layer as a patterned layer patterned to correspond to the pixel electrode 210. Thereafter, the opposite electrode 230 may be disposed on the entire flexible substrate 100.

Now referring to FIGS. 3 and 4, the encapsulation unit 300 may be formed on an upper side of the opposite electrode 230. In the drawings, the encapsulation unit 300 is illustrated as, for example, directly formed on the encapsulation unit 300. In an embodiment, a functional layer, such as, a capping layer (CLP), may be formed on the opposite electrode 230 and then the encapsulation unit 300 may be formed thereon.

First, the first inorganic film 310 may be formed on the opposite electrode 230. Thereafter, the organic film 320 may be formed on the first inorganic film 310. The organic film 320 may be formed by using the liquid phase deposition process, for example, the inkjet printing process. The second inorganic film 330 may be formed on the organic film 320. The first inorganic film 310 and the second inorganic film 330 may include an inorganic compound, for example, silicon oxide or silicon nitride. The encapsulation unit 300 may include a multilayer having at least one inorganic film and the organic film 320. The encapsulation unit 300 having such a structure may seal the display unit 200 from external oxygen and moisture.

The organic film 320 disposed between the first inorganic film 310 and the second inorganic film 330 may have the first thickness t1 in the bending area BA and the second thickness t2 in the first and second non-bending areas NBA1 and NBA2. The first thickness t1 of the organic film 320 may be thinner than the second thickness. The second thickness t2 of the organic film 320 in the first and second non-bending areas NBA1 and NBA2 may be thicker that the first thickness t1 of the organic film 320 in the bending area BA. The organic film 320 may have a thickness in the first and second non-bending areas NBA1 and NBA2 relatively thicker than the bending area BA by adjusting the amount of the organic compound when the organic film 320 may be formed.

The organic film 320 of the flexible display apparatus 1 according to an embodiment may minimize the stress in the bending area BA when being bent or folded in the bending area BA. When the flexible display apparatus 1 is bent, there may exist a neutral plane without stress since the tensile force and the compression force may be same inside the flexible display apparatus 1, and the stress in the flexible display apparatus 1 may increase according to a distance from the neutral plane. When a structure vulnerable to the stress is disposed on an upper side or a lower side with respect to the neutral plane, the structure may be exposed to continuing stress from the tensile force and the compression force. The stress that may be applied to the structure may be reduced when the neutral plane moves to a position of the structure by partially adjusting a thickness of the flexible display apparatus 1.

In the flexible display apparatus 1 according to an embodiment a thickness of the organic film 320 of the encapsulation unit 300 formed in the bending area BA may be partially adjusted. A position of the neutral plane may be controlled by forming the organic film 320 in the bending area BA to be relatively thinner than in the first and second non-bending areas NBA1 and BNA2. A flexible display apparatus 1 that may have minimized stress may be realized by displacing the structure vulnerable to the stress on the neutral plane.

By way of summation and review, an organic light-emitting device may include thin film transistors and organic light-emitting elements formed on a substrate, and the organic light-emitting elements themselves may emit light. The organic light-emitting device may be used as a display unit of a small product, such as, a mobile phone, or a large product, such as, a television.

A flexible display apparatus may include a flexible substrate including a material, such as, a resin composite, rather than a comparative glass substrate to have flexibility. Mechanical damage to a layer disposed in a bending area of a flexible display apparatus may occur, due to, for example, stress applied to the bending area while bending the flexible display apparatus.

One or more exemplary embodiments relate to a flexible display apparatus that may have reduced stress inside the flexible display apparatus during bending and a manufacturing method thereof.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A flexible display apparatus, comprising:
a flexible substrate including a bending area and a non-bending area;
a display unit on the flexible substrate; and
an encapsulation unit covering the display unit, the encapsulation unit including a first inorganic film, a second inorganic film, and an organic film between the first inorganic film and the second inorganic film, the organic film having a first thickness in the bending area and a second thickness greater than the first thickness in the non-bending area, the organic film not having the second thickness in the bending area, and the first inorganic film and the second inorganic film covering opposite surfaces of a portion of the organic film having the first thickness,
wherein the first thickness corresponds to a distance between the first inorganic film and the second inorganic film in the bending area, and the second thickness corresponds to a distance between the first inorganic film and the second inorganic film in the non-bending area, and
the first thickness of the organic film corresponding to the bending area is substantially uniform.

2. The flexible display apparatus as claimed in claim 1, wherein:
the non-bending area includes a first non-bending area and a second non-bending area, and
the bending area is between the first non-bending area and the second non-bending area.

3. The flexible display apparatus as claimed in claim 1, wherein:

the bending area includes a first bending area and a second bending area, and
the non-bending area is between the first bending area and the second bending area.

4. The flexible display apparatus as claimed in claim 3, wherein:
the first bending area has a first curvature, and
the second bending area has a second curvature smaller than the first curvature.

5. The flexible display apparatus as claimed in claim 4, wherein the organic film in the first bending area is thinner than the organic film in the second bending area.

6. The flexible display apparatus as claimed in claim 1, wherein the organic film is formed according to a liquid phase deposition process.

7. A manufacturing method of a flexible display apparatus, the method comprising:
providing a flexible substrate including a bending area and a non-bending area;
forming a display unit on the flexible substrate;
forming a first inorganic film covering the display unit;
forming an organic film on the first inorganic film, the organic film having a first thickness in the bending area and a second thickness greater than the first thickness in the non-bending area; and
forming a second inorganic film on the organic film, the organic film not having the second thickness in the bending area, and the first inorganic film and the second inorganic film covering opposite surfaces of a portion of the organic film having the first thickness,
wherein the first thickness corresponds to a distance between the first inorganic film and the second inorganic film in the bending area, and the second thickness corresponds to a distance between the first inorganic film and the second inorganic film in the non-bending area, and
the first thickness of the organic film corresponding to the bending area is substantially uniform.

8. The manufacturing method as claimed in claim 7, wherein:
the non-bending area includes a first non-bending area and a second non-bending area, and
the bending area is between the first non-bending area and the second non-bending area.

9. The manufacturing method as claimed in claim 7, wherein:
the bending area includes a first bending area and a second bending area, and
the non-bending area is between the first bending area and the second bending area.

10. The manufacturing method as claimed in claim 9, wherein:
the first bending area has a first curvature, and
the second bending area has a second curvature smaller than the first curvature.

11. The manufacturing method as claimed in claim 10, wherein the organic film in the first bending area is thinner than the organic film in the second bending area.

12. The manufacturing method as claimed in claim 7, wherein the organic film is formed according to a liquid phase deposition process.

13. A flexible display apparatus, comprising:
a flexible substrate including a bending area and a non-bending area;
a display unit on the flexible substrate; and
an encapsulation unit covering the display unit, the encapsulation unit including a first inorganic film, a second inorganic film, and an organic film between the first inorganic film and the second inorganic film, the organic film having a first thickness in the bending area and a second thickness greater than the first thickness in the non-bending area, and the first inorganic film and the second inorganic film covering opposite surfaces of a portion of the organic film having the first thickness, wherein the first thickness of the organic film in the entire bending area is thinner than the second thickness of the organic film in the non-bending area, wherein the first thickness corresponds to a distance between the first inorganic film and the second inorganic film in the bending area, and the second thickness corresponds to a distance between the first inorganic film and the second inorganic film in the non-bending area, and the first thickness of the organic film corresponding to the bending area is substantially uniform.

14. The flexible display apparatus as claimed in claim 13, wherein:

the non-bending area includes a first non-bending area and a second non-bending area, and the bending area is between the first non-bending area and the second non-bending area.

15. The flexible display apparatus as claimed in claim 13, wherein:

the bending area includes a first bending area and a second bending area, and the non-bending area is between the first bending area and the second bending area.

16. The flexible display apparatus as claimed in claim 15, wherein:

the first bending area has a first curvature, and the second bending area has a second curvature smaller than the first curvature.

17. The flexible display apparatus as claimed in claim 16, wherein the organic film in the first bending area is thinner than the organic film in the second bending area.

18. The flexible display apparatus as claimed in claim 13, wherein the organic film is formed according to a liquid phase deposition process.

* * * * *